United States Patent [19]

Ito et al.

[11] Patent Number: 5,346,557

[45] Date of Patent: Sep. 13, 1994

[54] PROCESS FOR CLEANING SILICON MASS AND THE RECOVERY OF NITRIC ACID

[75] Inventors: Hideo Ito; Mitsutoshi Narukawa; Kazuhiro Sakai, all of Yokkaichi, Japan

[73] Assignee: Hi-Silicon, Co., Ltd., Mie, Japan

[21] Appl. No.: 967,066

[22] Filed: Oct. 28, 1992

[30] Foreign Application Priority Data

Oct. 29, 1991 [JP] Japan .................................. 3-308268
Oct. 31, 1991 [JP] Japan .................................. 3-311484

[51] Int. Cl.$^5$ .............................................. B08B 3/04
[52] U.S. Cl. ............................................. 134/10; 134/3; 134/12; 134/30
[58] Field of Search ................... 134/10, 12, 3, 30; 203/50; 156/642; 423/394.2

[56] References Cited

U.S. PATENT DOCUMENTS 4,695,327  9/1987  Grebinski ........................... 134/11
4,971,654 10/1990  Schnegg et al. ..................... 156/638

Primary Examiner—Michael Lewis
Assistant Examiner—Thomas G. Dunn, Jr.
Attorney, Agent, or Firm—Birch, Stewart, Kolasch & Birch

[57] ABSTRACT

In a process for cleaning a silicon mass with a acid washing solution, a waste solution containing a mixed acid composed of nitric acid and hydrofluoric acid is introduced to a distillation step, and hydrofluoric acid is introduced to a distillation cooling portion to prevent precipitation of silicon dioxide. The waste cleaning liquor is distilled to recover nitric acid.

18 Claims, 1 Drawing Sheet

PROCESS FOR CLEANING SILICON MASS AND THE RECOVERY OF NITRIC ACID

BACKGROUND OF THE INVENTION

1. Field of the Invention

The present invention relates to improvement in the process for cleaning a silicon mass such as a polycrystalline silicon mass with an acid. More particularly, the present invention relates to a process for cleaning a silicon mass in which nitric acid is effectively recovered for reuse from the waste solution of a treatment solution which is used as a cleaning solution or an etchant and comprised mainly of a mixed acid composed of nitric acid and hydrofluoric acid, as well as to a process for removing such an acid adhering to a silicon mass, more specifically a process for cleaning a silicon mass, particularly a polycrystalline silicon mass, in which the silicon mass is etched with such an acid and then the acid adhering to the silicon mass is removed rapidly.

2. Description of the Prior Art

A treatment solution comprised mainly of fluoronitric acid, which is a mixture of nitric acid and hydrofluoric acid has heretofore been used as a cleaning liquid or an etchant for a polycrystalline silicon mass or a silicon wafer. In the conventional acid-washing processes, the treatment solution which contains impurities at high concentrations and is thus no more usable is disposed of as a waste. However, the waste treatment solution still contains nitric acid in an amount of 40 to 50% by weight and is a high concentration, strongly acidic solution, and hence the waste disposal must be subjected to a neutralization treatment or the like which incurs unnegligible cost. The waste disposal raises a more severe problem as the amount of silicon to be treated increases. Therefore, it is desired to recover nitric acid and the like from the waste treatment solution to decrease cost incurred in the waste disposal and reuse nitric acid.

Despite attempts to recover nitric acid from the waste solution produced and reuse it in the process of cleaning silicon, it has been difficult to recover nitric acid effectively. For example, for the surface treatment of stainless steel plates, there have been known several processes for recovering acids from a waste acid solution containing a mixed acid composed of nitric acid and hydrofluoric acid by distillation (Japanese Patent Publication No. 11755/1981, etc.). In actuality, when attempts were made to separate the waste acid by distillation according to the conventional processes, the piping would be clogged to make it difficult to continue the distillation so that the separation and recovery of nitric acid, etc., are difficult in the case where the waste solution from the silicon treatment process is handled.

In addition to the problem of disposal of the waste cleaning solution, the acid-washing of a silicon mass has a problem in rinsing after the acid-washing as described below. For example, in the production of a highly pure polycrystalline silicon, the cleaning is carried out after the silicon is grown in the form of a rod, and cut or crushed to an appropriate size to form a cylindrical mass (referred to as "chunk") or a small mass (referred to as "lump"). As already stated, the cleaning is performed by etching the silicon mass with an etchant comprised mainly of hydrofluoric acid and nitric acid to remove impurities adhering to and an oxide coating formed on the surface of the silicon mass, and then rinsing the remaining etchant with purified water. Thereafter, the cleaned silicon mass is transferred to a drying step.

Since the etchant is a strongly acidic solution, it is necessary to remove the solution as completely as possible in order to obtain a clean silicon mass. However, the silicon mass obtained as described above has a complicated surface structure having minute hollow portions as viewed on a microscopic scale so that the acid used as the etchant spreads in the hollow portions. As a result, mere spraying of water onto the surface of the silicon mass is insufficient for the acid which has permeated or adhered to the surface of the silicon mass to be removed completely. For this reason, the silicon mass is immersed in a purified water bath to remove the acid as completely as possible.

Although this process is advantageous in that it is simple, it takes a long time in the cleaning step. At present, the silicon mass must be immersed for one night while exchanging rinsing water several times to decrease the amount of nitric acid ion which remains after the cleaning treatment to an acceptable level for practical use. In the immersion cleaning process, not only a large space is required for an immersion bath but also production of a large amount of purified water and recovery thereof are necessary. Furthermore, in the process, the acid is removed by spontaneous diffusion, and hence it is often the case that the removal of the acid is incomplete depending on the condition of the surface of the silicon mass. Therefore, there has been a keen desire to rationalize the process by enabling the removal of acid with a smaller amount of purified water and in a shorter time.

SUMMARY OF THE INVENTION

The present invention solves the aforementioned problems and provides a process for effectively recovering nitric acid from a waste cleaning solution for reuse.

Also, the present invention provides a process for acid-washing a silicon mass, in which the acid adhering to the silicon mass after the acid-washing is removed rapidly.

Specifically, according to one aspect of the present invention, there is provided a process for cleaning a silicon mass by acid-washing with a cleaning solution containing a mixed acid composed of nitric acid and hydrofluoric acid, comprising the steps of: introducing a waste cleaning solution to a distillation step after washing with said cleaning solution; introducing hydrofluoric acid to a distillation cooling portion to prevent precipitation of silicon dioxide; and distilling the waste cleaning liquor to recover the nitric acid In a preferred embodiment of the aforementioned process of the present invention, the nitric acid recovered from the waste solution may be added to the cleaning solution for reuse.

In another preferred embodiment of the aforementioned process of the present invention, the waste solution may be continuously distilled while continuously flowing a small amount of hydrofluoric acid into the distillation cooling portion.

In a still another preferred embodiment of the aforementioned process of the present invention, after the acid-washing, a waste solution is introduced to a distillation step, and the silicon mass cleaned may be retained in steam of high purity so that acid remaining on the surface of the silicon mass can be rinsed and removed with condensed water formed on the surface of the silicon mass.

According to another aspect of the present invention, there is provided a process for cleaning a silicon mass by acid-washing with a cleaning solution containing a mixed acid composed of nitric acid and hydrofluoric acid, comprising the step of: retaining in steam of high purity a cleaned silicon mass after acid-washing so that acid remaining on the surface of the cleaned silicon mass can be rinsed and removed with condensed water formed on the surface of the silicon mass.

In the present invention, the cause of the clogging of the piping upon distilling a waste silicon cleaning liquor was analyzed, and it has now been found that a soluble silicon compound present in the waste silicon etching solution as a result of the cleaning of silicon or etching is thermally decomposed upon distillation to produce silicon tetrafluoride ($SiF_4$), which is distilled off together with nitric acid and hydrofluoric acid and reacts with moisture in a distillation condensing portion to precipitate silicon dioxide, thus clogging the piping. Incidentally, the silicon compound dissolved in the waste cleaning solution is mainly hydrosilicofluoric acid ($H_2SiF_6$) and contains a smaller amount of silicon fluoride. The silicon etching solution is a fluoro-nitric acid solution composed of nitric acid and hydrofluoric acid and presence of a small amount of silicon therein causes no problem for etching the silicon mass. Accordingly, if silicon dioxide precipitated in the distillate is dissolved with hydrofluoric acid, the distillate containing the resulting solution of silicon dioxide may be added as it is to the silicon etching solution for reuse. Therefore, continuous distillation can be realized by flowing a small amount of hydrofluoric acid to the condensing portion. Hydrofluoric acid contained in the silicon etchant is mostly consumed in the etching-cleaning of silicon to form hydrosilicofluoric acid ($H_2SiF_6$), and at a lower temperature region hydrofluoric acid component is distilled out together with silicon dioxide. Therefore, in batch treatments, high purity nitric acid containing only a small amount of hydrofluoric acid and other impurities can be recovered effectively if the initial distillates are discarded since silicon dioxide and hydrofluoric acid are mainly distilled out at initial stages of distillation.

On the other hand, the present inventors tried to improve the washing step for rinsing acidic solution remaining on the silicon mass, and investigated various processes such as a process in which a silicon mass is repeatedly immersed in a plurality of cleaning baths, a process in which hot water is used in the cleaning bath, and a process in which ultrasonic cleaning is performed in the cleaning bath. However, none of these processes investigated showed any significant improvement. As a result of further investigation, it has now been found that quite unexpectedly, preheating with steam as a pretreatment to be followed by a drying step was successful in efficiently removing the acid in a short time. The present invention is based on this discovery.

Figure 1:
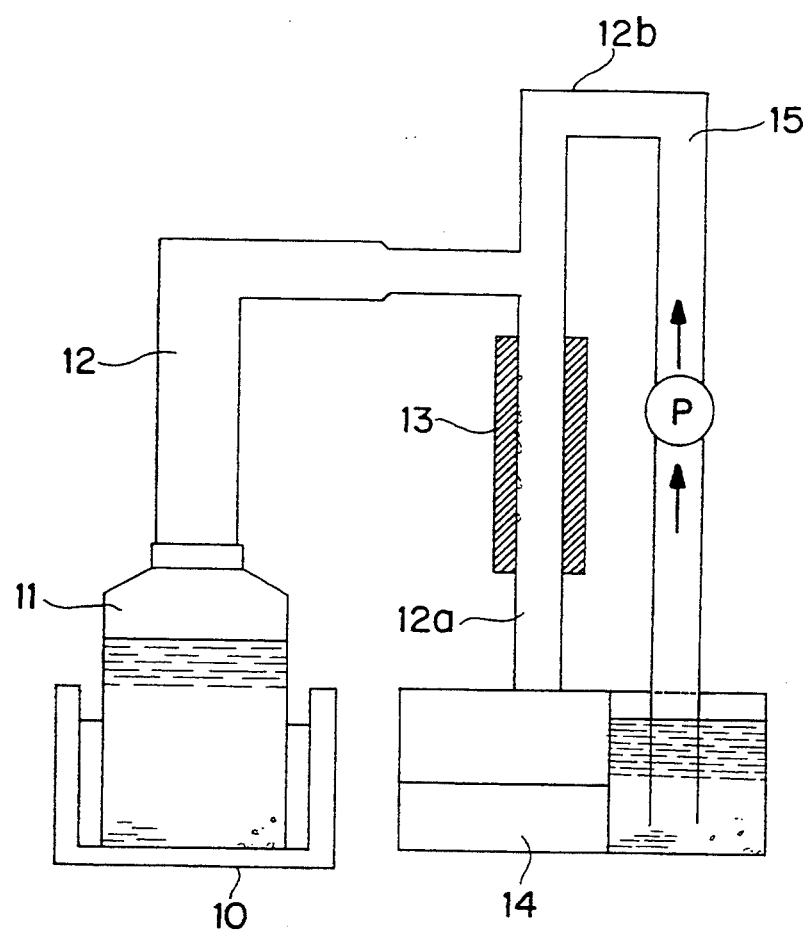
FIG. 1 is a schematic cross sectional view showing a distillation vessel for practicing the process of the present invention.

DETAILED DESCRIPTION OF THE INVENTION (1) Distillation Step of a Waste Solution

Fluoro-nitric acid solution used as a cleaning solution or an etchant for silicon contains 40 to 60% by weight of nitric acid and 2 to 30% by weight of hydrofluoric acid. In the reaction of etching a silicon mass, Si reacts with nitric acid ($HNO_3$) and hydrofluoric acid (HF) to produce hydrosilicofluoric acid ($H_2SiF_6$), nitrogen dioxide ($NO_2$) and water ($H_2O$) as follows:

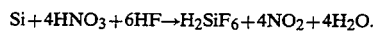

On the other hand, silicon (Si) reacts with nitric acid ($HNO_3$) and hydrofluoric acid (HF) to produce hydrosilicofluoric acid ($H_2SiF_6$), nitrogen monoxide (NO) and water ($H_2O$) as follows:

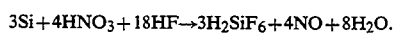

As will be understood from the above reaction schemes, the amount of hydrofluoric acid consumed is larger than that of nitric acid, and in addition, hydrofluoric acid is more expensive than nitric acid. Therefore, in usual acid washing step or cleaning steps, the etching solution is used repeatedly until the concentration of impurities increases so high as to exceed acceptable level for use while replenishing hydrofluoric acid. For example, the etching solution is disposed of as a waste solution when the concentration of impurities in the solution has reached about 1 ppm. The waste solution, which has almost no etching effect against Si, contains about 40 to 50% by weight of nitric acid. The waste solution also contains 1 to 20% by weight of hydrosilicofluoric acid ($H_2SiF_6$).

The process of the present invention is to distill the waste solution and recover nitric acid therefrom. FIG. 1 shows an example of a distillation apparatus which can be used in the process of the present invention. In FIG. 1, the distillation apparatus includes an oil bath 10 in which a waste solution bottle 11 is arranged. A branched pipe 12 is connected to an upper end of the waste bottle 11. A cooling portion 13 is formed near one end 12a of the branched pipe 12 which end opens in a collecting vessel 14 for collecting a distillate. The other end 12b of the branched pipe 12 is connected to a feed pipe 15 for feeding hydrofluoric acid so that hydrofluoric acid is flown to the cooling portion 13 through the feed pipe 15.

When the waste solution is heated for distillation to a temperature higher than the boiling points of hydrofluoric acid and nitric acid, i.e., about 110° C. and about 121° C., respectively, usually 100° to 125° C., first a water-hydrofluoric acid system distills out at a lower temperature region. Here, hydrofluoric acid in the waste solution is dissolved therein in the form of hydrosilicofluoric acid ($H_2SiF_6$), and this compound upon the heating of the waste solution is decomposed to silicon fluoride, which has a boiling point not exceeding 0° C. Silicon fluoride distills together with hydrofluoric acid and reacts with moisture to form silicon dioxide which precipitates in the cooling portion. Hence, hydrofluoric acid is passed through the cooling portion 13 to dissolve therewith silicon dioxide which precipitated there, in order to remove it. Hydrofluoric acid may be fed in the form of a liquid which flows down or sprayed as a shower in the cooling portion 13. Silicon dioxide is dissolved in hydrofluoric acid and washed out from the cooling portion 13.

In operating the aforementioned distillation apparatus, hydrofluoric acid may be fed when the precipitation of silicon dioxide is observed. Upon the feeding of hydrofluoric acid, silicon dioxide precipitate is dissolved and removed in a few minutes. When the process of the present invention is practiced on an industrial scale, the timing when the addition of hydrofluoric acid is to be started and the amount of hydrofluoric acid to be added may be set up depending on the concentration of hydrosilicofluoric acid. In the case of batch distillation, silicon dioxide precipitates at an initial stage of distillation but no precipitation occurs in a later stage. When the waste solution is to be distilled continuously, the distillation is performed while flowing down a small amount of hydrofluoric acid.

As described above, in the distillation of the waste solution, a water-hydrofluoric acid system distills at a lower temperature region. Since much of hydrofluoric acid is dissolved in the waste solution in the form of hydrosilicofluoric acid, in the case of batch distillation hydrofluoric acid distills out simultaneously with the precipitation of silicon dioxide at the initial stage of distillation, and then mainly a nitric acid-water system distills out, thus the concentration of nitric acid is increased gradually. The precipitation of silicon dioxide is decomposed by hydrofluoric acid flowing down. Excepting the initial distillate in which silicon dioxide is dissolved, subsequently obtained nitric acid fractions are collected. Metallic impurities other than silicon contained in the etching solution remain in the waste solution. In this case, the use of a distillation system made of Teflon (polytetrafluoroethylene) makes it possible to recover high purity nitric acid with no contamination in the distillation system. For example, when a mixed acid composed of nitric acid and hydrofluoric acid which is commercially available and has an electronic industry grade is used as a cleaning solution for polycrystalline silicon, and the resulting waste solution is distilled by the process of the present invention, nitric acid of a considerably high purity can be obtained; the concentration of impurities in the nitric acid recovered is by about 1/10 time as high as that of the impurities in the commercially available nitric acid solution.

Since the washing solution is a mixed acid composed of hydrofluoric acid and nitric acid, if a small amount of silicon is present therein, such silicon does not serve as a contaminant in the etching or cleaning of silicon, and thus in order to reuse it, the distillate can be added as it is without removing initial distillate to a fresh washing solution replenished with hydrofluoric acid. Therefore, a waste solution can be continuously reused by continuously distilling it while flowing a small amount of hydrofluoric acid through the cooling portion and adding recovered nitric acid to a fresh washing solution.

An example of continuous distillation is performed at a temperature of 120° to 125° C. in a distillation apparatus having a similar arrangement as shown in FIG. 1 but differing in that a branching portion is provided each at a lower boiling point region where mainly a water-hydrofluoric acid system distills and at a higher boiling point region where mainly a water-nitric acid system distills midway between the waste liquor bottle 10 and the cooling portion 13, with nitric acid being continuously recovered from the branching portion at the higher boiling point region. In this case, a mixed acid of fluoro-nitric acid is obtained. As another example, at least two distillation apparatuses are used. The first distillation vessel is heated at 110° to 120° C. to distill out a lower boiling point portion comprised mainly of hydrofluoric acid, and the residue in the first distillation vessel is introduced into the second distillation vessel which is heated to 120° to 125° C. to distill out a higher boiling point portion comprised mainly of nitric acid. In this case, silicon fluoride has already been separated in the first distillation step and there is no need for flowing down hydrofluoric acid through the cooling portion, resulting in that nitric acid fractions containing much less hydrofluoric acid component can be obtained. According to a still another example of continuous distillation using two distillation apparatuses, distillation may be carried out as follows. That is, the first distillation vessel is heated to 120° to 125° C. to distill out hydrofluoric acid and nitric acid, and then the distillate is introduced into the second distillation vessel which is heated to 100° to 110° C. to distill out hydrofluoric acid, a lower boiling point component, and nitric acid as a residue is recovered.

(2) Rinsing Step After Acid-Washing

The silicon mass cleaned in the aforementioned cleaning step is retained in steam in high purity to condense water on the surface of the silicon mass to wash and remove acid remaining on the surface of the silicon mass with the condensed water.

Steam of purified water is generated by heating purified water by a conventional method. The steam is fed in such an amount that steam is condensed on the surface of the silicon mass and condensed water is renewed by turns. For example, when a silicon mass at ambient temperature is conveyed in steam at 100° C. at atmospheric pressure, it is sufficient to generate steam in an amount of about 0.5 g/minute per unit volume (liter) of steam chamber. The temperature of steam is usually about the boiling point of water in the system concerned. The pressure of steam is not limited particularly but a pressure of about one to several times as high as the outer pressure is preferred in order to simplify the arrangement of the apparatus. So far as the quality of the silicon mass is not deteriorated, high temperature or high pressure steam may be used.

The manner in which the silicon mass is retained in steam is not limited particularly. It may be retained in a chamber filled with steam or steam may be blown onto the silicon mass under the conditions that the whole surface of the silicon mass is covered by the steam. Preferably, the silicon mass is retained in a stream of steam so that the condensation of steam proceeds rapidly. The silicon mass may be retained on a net or a cage made of a material which is not a source of contamination to silicon.

While it varies depending on the absolute amount of the residual acid and the shape of the silicon mass, the retention time may as a rough measure be as long as the surface of the silicon mass is wetted with condensed water. Usually, the retention time is on the order of several minutes, and is drastically shortened as compared with the conventional immersion cleaning process.

In the process of the present invention, steam of purified water condenses on the silicon mass and the residual acid on the surface thereof migrates into the condensed water and then the condensed water having dissolved therein the acid is removed from the silicon. It is essential that these steps are carried out in order, and it should be noted that the temperature, flow rate of steam, retention time, etc. are determined depending on whether such steps are achieved or not. Although it is unclear what a mechanism the effect of the present invention is ascribable to, it would be possible that steam (water) molecules permeate into fine surface structure such as unevenness or cracks on the surface of the silicon mass and dissolves the acid adhering to the structure; the heat generated when steam condensed causes the surface of the silicon mass and gases staying thereon to expand locally to facilitate the removal of acids; and so on. However, as will be apparent from the comparison between examples and comparative examples described later on, the effect of the present invention is remarkable since the removal of acid is achieved in a few minutes in the present invention.

The rinsing step may be performed in combination with a prerinsing step. More specifically, it is preferred to carry out prerinsing prior to the rinsing process described above. In this case, the cleaning with steam is performed after drying to such an extent that the effect of the present invention is not harmed. Postcleaning may be performed in order to wash the condensed water off. Remarkable effects can be achieved by performing the rinsing step in combination with a prerinsing step.

ADVANTAGES OF THE PRESENT INVENTION

When nitric acid is to be recovered by distilling a waste solution, it has been often difficult to recover nitric acid since clogging of the distillation system occurs. On the contrary, according to the present invention, the clogging of the distillation system is solved and nitric acid can be recovered efficiently. The concentration of impurities contained in nitric acid to be recovered by the process of the present invention is lower than commercially available nitric acid, and thus nitric acid of high purity can be obtained according to the invention.

Also, according to the process of the present invention, the removal of acids can be achieved in a few minutes, resulting in reduction in time required for cleaning a silicon mass. In addition, the process of the present invention is economically advantageous since the use of a large amount of water for immersion is unnecessary, which minimizes the amount of purified water to be used and reduces the space required for arranging an immersion bath. Furthermore, according to the process of the present invention, the silicon mass is contacted with steam and its temperature increases thereby, resulting in that the time of drying in the subsequent step can also be shortened.

EXAMPLES

Hereinafter, the present invention will be described in more detail by examples. However, the present invention should not be construed as being limited thereto.

EXAMPLE 1

The distillation apparatus shown in FIG. 1 having a distillation vessel 11 in the form of a 6-liter Teflon bottle to which was connected a Teflon branching pipe 12 was used. Five (5) liters of a waste silicon cleaning liquor (nitric acid: 45% by weight, hydrofluoric acid: 0.5% by weight, hydrosilicofluoric acid: 6% by weight) were charged in the distillation vessel and heated to 100° C. to initiate distillation. Immediately after the initiation of distillation, white solids began to precipitate on the inner wall of the cooling portion 13, and hydrofluoric acid was added down through the pipe 15 to the cooling portion 13 at a rate of 40 ml/minute for 40 minutes. As a result, the solids on the inner wall of the pipe were dissolved rapidly. The distillation was continued while stopping the supply of hydrofluoric acid from time to time and observing the state of precipitation of the solids. When 1.5 liters of the distillate accumulated, no more precipitation of the solids was observed, and the supply of hydrofluoric acid was stopped. After discarding initial distillates, the distillation was continued for an additional 25 hours to obtain 3 liters of nitric acid.

Nitric acid was recovered in the same manner as described above from various samples. The concentrations of metallic impurities in the nitric acid obtained were as shown in Table 1. As shown in Table 1, the concentration of impurities in the nitric acid recovered was much lower than commercially available nitric acid of an electronic industry grade. Thus, nitric acid of high purity was recovered.

At least two distillation apparatuses of the same type as described above were used. The first distillation vessel was heated to 110° to 120° C. to distill out a lower boiling point portion comprised mainly of hydrofluoric acid, and the residue in the first distillation vessel was introduced into the second distillation vessel which was heated to 120 to 125° C. to distill out a higher boiling point portion comprised mainly of nitric acid. The distillation conditions and the amount of the impurities in the recovered nitric acid are shown in Tables 2 and 3, respectively.

EXAMPLE 2

Three hundred (300) milliliters (ml) of the recovered nitric acid obtained in Example 1 (concentration of nitric acid: 62.48% by weight, concentration of hydrofluoric acid: 2.1% by weight), and 300 ml of 50% hydrofluoric acid were mixed to prepare a silicon etching solution, and an etching test for silicon was conducted using the etching solution thus obtained. For comparison, the etching test for silicon was conducted under the same conditions using commercially available nitric acid of an electronic industry grade to which no recovered nitric acid was added The results obtained are shown in Table 4. As shown in Table 4, the etching solution containing the recovered nitric acid had an etching rate equal to that of the etching solution not containing the recovered nitric acid. The resistivity of the silicon measured was substantially the same. As will be apparent from the results, the recovered nitric acid was able to be reused as an etching solution.

EXAMPLE 3

An acid-washing bath containing about 10 liters of an acid composition composed of 60% nitric acid and 50% hydrofluoric acid in a proportion of 9:1 and seven prerinsing baths containing each about 15 liters of purified water were provided.

A silicon lump weighing about 3 kg was placed in a cage made of a resin and the cage was immersed in the acid-washing bath for about 40 seconds and precleaned in the prerinsing baths. The prerinsing was performed by repeating a unit operation of 10 seconds immersion followed by 5 seconds withdrawing for 2 minutes per bath. This prerinsing operation was repeated for all the baths in order. Then, the thus prerinsed silicon lump together with the cage was placed in a commercially available stainless steel kettle filled with steam of purified water generated by charging purified water in the kettle and heating. The silicon lump was retained in steam for 5 minutes. Thereafter, condensed water was washed out with about 4 liters of purified water.

To determine the amount of nitric acid remaining on the surface of the silicon lump, the silicon lump together with the cage was immersed in 7 liters of purified water for one night. After completion of the immersion, the concentration of nitric acid ion in the immersing water was measured using a nitric acid ion electrode. Results obtained indicated it was below 0.1 ppm, a detection limit.

COMPARATIVE EXAMPLE 1

A silicon lump was cleaned in the same manner as in Example 3 except that the prerinsing process was not used. The amount of acid remaining on the surface of the silicon lump was determined in the same manner as in Example 1. As a result, the concentration of nitric acid ion was 0.50 ppm.

COMPARATIVE EXAMPLE 2

A silicon lump was cleaned in a conventional manner. More specifically, the cleaning procedure was performed as follows.

An acid-washing bath containing about 10 liters of an acid composition composed of 60% nitric acid and 50% hydrofluoric acid in a proportion of 9:1 and two rinsing baths containing each about 15 liters of purified water were provided.

A silicon lump weighing about 3 kg was placed in a cage made of a resin and the cage was immersed in the acid-washing bath for about 40 seconds and precleaned in the rinsing baths. The rinsing was performed by repeating a unit operation of 10 seconds' immersion followed by 5 seconds' withdrawing for 2 minutes per bath. This prerinsing operation was repeated for the both baths in order. Then, the thus prerinsed silicon lump together with the cage was immersed in 7,000 liters of purified water for one night. The purified water in the bath was wholly replaced with the same amount of fresh purified water for every 4 hours three times.

To determine the amount of nitric acid remaining on the surface of the silicon lump, the silicon lump together with the cage was immersed in 7 liters of purified water for one night. After completion of the immersion, the concentration of nitric acid ion in the immersing water was measured using a nitric acid ion electrode. Results obtained indicated it was below 0.34 ppm, a detection limit.

COMPARATIVE EXAMPLE 3

A silicon lump was cleaned in the same manner as in Example 3 except that the prerinsing process was replaced by immersion in hot water at 75° C. for 5 minutes. The amount of acid remaining on the surface of the silicon lump was determined in the same manner as in Example 3. As a result, the concentration of nitric acid ion was 0.51 ppm, and the hot water immersion had no effect.

TABLE 1

Amount of Impurities in Recovered Nitric Acid
Unit: $10^{-9}$ g/ml (ng/ml: ppb)

| Element | Commercially Available Nitric Acid | Recovered Nitric Acid Sample 1 | Sample 2 | Sample 3 | Distillation Residue |
|---|---|---|---|---|---|
| Al | 10.0 | 0.8 | 0.7 | 0.9 | 530–600 |
| B | 0.6 | <0.2 | <0.2 | <0.2 | 160–240 |
| Ca | 34.0 | 0.1 | 0.1 | <0.1 | 4400–500 |
| Cr | 70.0 | <0.1 | <0.1 | <0.1 | 1300–220 |
| Cu | 0.1 | <0.1 | <0.1 | <0.1 | 1800–240 |
| Fe | 6.0 | 0.9 | 0.6 | 0.8 | 7300–8700 |
| K | 4.0 | 0.1 | <0.1 | 0.1 | 720–950 |
| Li | 0.1 | <0.1 | <0.1 | <0.1 | <0.1 |
| Mg | 9.0 | 2.0 | 2.0 | 1.0 | 600–730 |
| Na | 300.0 | 20.0 | 30.0 | 20.0 | 3000–4200 |
| Ni | 0.5 | <0.1 | <0.1 | <0.1 | 120–280 |
| P | 1.0 | <1.0 | <1.0 | <1.0 | 40–60 |
| Ti | 100.0 | 20.0 | 20.0 | 20.0 | 1100–1900 |
| Si | 210 ppm | 150 ppm | 320 ppm | 320 ppm | 28 ppm |

TABLE 2

Conditions of Continuous Distillation

| Heating Temperature (°C.) | |
|---|---|
| First Still Pot | 110–120 |
| Second Still Pot | 120–125 |
| Amount of Waste Liquor | 10 ml/minute |
| Amount of Liquor Withdrawn First Still Pot | 7–8 ml/minute |
| Amount of Hydrofluoric Acid Dropped to Cooling Portion | 5 ml/minute |

TABLE 3

Amount of Impurities in Nitric Acid Recovered
by Continuous Distillation
Unit: $10^{-9}$ g/ml (ng/ml: ppb)

| Element | Recovered Nitric Acid Sample 1 | Sample 2 | Sample 3 |
|---|---|---|---|
| Al | 1.0 | 1.1 | 0.9 |
| B | <0.2 | <0.2 | <0.2 |
| Ca | 0.2 | 0.4 | <0.2 |
| Cr | <0.1 | <0.1 | <0.1 |
| Cu | <0.1 | <0.1 | <0.1 |
| Fe | 1.0 | 1.5 | 1.0 |
| K | 0.2 | 0.1 | <0.1 |
| Li | <0.1 | <0.1 | <0.1 |
| Mg | 3.0 | 1.0 | 3.0 |
| Na | 50.0 | 60.0 | 30.0 |
| Ni | <0.1 | <0.1 | <0.1 |
| P | <1.0 | <1.0 | <1.0 |
| Ti | 5.0 | 3.0 | 6.0 |
| Si | 500 ppm | 600 ppm | 500 ppm |

TABLE 4

| Nitric Acid Used As Etching Liquor | Silicon Etching Rate | Resistivity (Ω · cm) Sample 1 | Sample 2 | Sample 3 |
|---|---|---|---|---|
| Recovered Nitric Acid | 13 μm/minute | 2840 | 2520 | 2700 |
| Commercially Available Nitric Acid | 12 μm/minute | 2820 | 2600 | 2700 |

What is claimed is:

1. A process comprising:
sufficiently heating a liquid waste solution "obtained from cleaning a polycrystalline silicon mass" has been inserted after which comprises nitric acid, hydrofluoric acid, hydrosilicofluoric acid, and water so as to boil off a hydrofluoric acid containing vapor;

transmitting said hydrofluoric acid containing vapor, said heating being effective to remove the hydrosilicofluoric acid to a condensation region;

condensing said vapor in said condensation region to form a liquid condensate; and recovering said nitric acid as a substantially pure solution;

wherein liquid hydrofluoric acid is added to said condensation region during said condensing step.

2. The process according to claim 1, wherein the addition of said liquid hydrofluoric acid to said condensation region begins when silicon dioxide precipitate is detected in said condensation region and is continued at least until said precipitate is no longer apparent.

3. The process according to claim 1, wherein the addition of said liquid hydrofluoric acid to said condensation region is continuous during said condensing step.

4. The process according to claim 1, wherein said heating step is carried out such that said hydrofluoric acid containing vapor is substantially a hydrofluoric acid-water system that does not substantially contain any nitric acid.

5. The process according to claim 4, wherein said recovering of said nitric acid comprises continuing to heat a remainder portion of said liquid waste solution after said hydrofluoric acid-water system has been boiled off, so as to boil off a predominantly nitric acid containing vapor; transmitting said nitric acid containing vapor to a condensation region; condensing said nitric acid containing vapor thereat and collecting said substantially pure nitric acid solution.

6. The process according to claim 4, wherein said recovering step comprises transferring a remainder portion of said liquid waste solution after said hydrofluoric acid-water system has been substantially boiled off, to a distillation apparatus; and subjecting said remainder portion to a distillation treatment to thereby obtain said substantially pure nitric acid solution.

7. The process according to claim 4, wherein said heating step is carried out at a temperature of about 110° to 120° C.

8. The process according to claim 1, wherein said heating step boils off simultaneously both said nitric acid and said hydrofluoric acid as said vapor.

9. The process according to claim 8, wherein said condensate contains both nitric and hydrofluoric acid and said recovering step comprises distilling out said hydrofluoric acid so as to form a substantially pure nitric acid solution from said condensate.

10. The process according to claim 8, wherein said condensation region has a lower boiling point condensation zone and a higher boiling point condensation zone; and said condensing and recovery steps comprise condensing said nitric acid at said higher boiling point condensation zone and collecting therefrom said substantially pure nitric acid solution, and condensing said hydrofluoric acid at said lower boiling point condensation zone.

11. The process according to claim 8, wherein said heating step is carried out at a temperature of about 120° to 125° C.

12. A process for cleaning silicon mass, which comprises:

forming a cleaning solution by combining nitric acid, hydrofluoric acid, and water;

employing said cleaning solution in an acid wash of silicon mass, thereby generating hydrosilicofluoric acid; and recovering the nitric acid contained in said hydrosilicofluoric acid-containing solution by the process of claim 1.

13. The process according to claim 12, wherein said nitric acid is continuously recovered.

14. The process according to claim 13, wherein the nitric acid used to form said cleaning solution comprises the recovered nitric acid.

15. The process according to claim 12, wherein said recovery step is carried out whenever the concentration of hydrosilicofluoric acid becomes sufficiently high such that the cleaning solution is no longer sufficiently effective in cleaning silicon mass.

16. The process according to claim 15, wherein the nitric acid used to form said cleaning solution comprises the recovered nitric acid.

17. The process according to claim 12, wherein after said acid wash, said washed silicon mass is retained in steam of high purity so that acid remaining on the surface of said silicon mass can be rinsed and removed with condensed water formed on the surface of said silicon mass.

18. The process according to claim 12, wherein after said acid wash, said washed silicon mass is immersed in purified water, and then retained in steam of high purity so that acid remaining of the surface of said silicon mass can be rinsed and removed with condensed water formed on the surface of said silicon mass.

* * * * *